(12) United States Patent
Ng et al.

(10) Patent No.: US 10,522,507 B2
(45) Date of Patent: Dec. 31, 2019

(54) SEMICONDUCTOR DEVICE ASSEMBLIES INCLUDING MULTIPLE SHINGLED STACKS OF SEMICONDUCTOR DIES

(71) Applicant: Micron Technology, Inc., Boise, ID (US)

(72) Inventors: Hong Wan Ng, Singapore (SG); Akshay N. Singh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/383,903

(22) Filed: Apr. 15, 2019

(65) Prior Publication Data

US 2019/0244930 A1    Aug. 8, 2019

Related U.S. Application Data

(62) Division of application No. 15/806,808, filed on Nov. 8, 2017, now Pat. No. 10,312,219.

(51) Int. Cl.
*H01L 21/00* (2006.01)
*H01L 25/065* (2006.01)
(Continued)

(52) U.S. Cl.
CPC .......... *H01L 25/0652* (2013.01); *H01L 23/50* (2013.01); *H01L 24/48* (2013.01); *H01L 24/49* (2013.01); *H01L 24/85* (2013.01); *H01L 25/0657* (2013.01); *H01L 25/50* (2013.01); *H01L 2224/48091* (2013.01); *H01L 2224/48106* (2013.01); *H01L 2224/48145* (2013.01); *H01L 2224/48227* (2013.01);
(Continued)

(58) Field of Classification Search
None
See application file for complete search history.

(56) References Cited

U.S. PATENT DOCUMENTS

2008/0061421 A1  3/2008  Shen et al.
2009/0273096 A1*  11/2009  Hiew ............... H01L 21/565
                                                257/777
(Continued)

FOREIGN PATENT DOCUMENTS

KR    20060041538 A    5/2006
KR    20110138788 A    12/2011

OTHER PUBLICATIONS

International Application No. PCT/US2018/050075—International Search Report and Written Opinion, dated Jan. 7, 2019, 13 pages.
(Continued)

*Primary Examiner* — Reema Patel
(74) *Attorney, Agent, or Firm* — Perkins Coie LLP

(57) ABSTRACT

A semiconductor device assembly includes a substrate having a plurality of external connections, a first shingled stack of semiconductor dies disposed directly over a first location on the substrate and electrically coupled to a first subset of the plurality of external connections, and a second shingled stack of semiconductor dies disposed directly over a second location on the substrate and electrically coupled to a second subset of the plurality of external connections. The semiconductor device assembly further includes an encapsulant at least partially encapsulating the substrate, the first shingled stack and the second shingled stack.

9 Claims, 6 Drawing Sheets

(51) Int. Cl.
    *H01L 25/00*         (2006.01)
    *H01L 23/00*         (2006.01)
    *H01L 23/50*         (2006.01)

(52) U.S. Cl.
    CPC ............... *H01L 2224/48235* (2013.01); *H01L 2224/49109* (2013.01); *H01L 2224/49112* (2013.01); *H01L 2224/49176* (2013.01); *H01L 2224/85986* (2013.01); *H01L 2225/0651* (2013.01); *H01L 2225/06506* (2013.01); *H01L 2225/06548* (2013.01); *H01L 2225/06562* (2013.01); *H01L 2225/06565* (2013.01)

(56) References Cited

U.S. PATENT DOCUMENTS

| | | | |
|---|---|---|---|
| 2013/0200530 A1* | 8/2013 | Song | ............... H01L 25/074 257/777 |
| 2014/0252640 A1 | 9/2014 | Kwak | |
| 2014/0361441 A1 | 12/2014 | Bae et al. | |
| 2015/0200187 A1 | 7/2015 | Park et al. | |
| 2016/0093598 A1 | 3/2016 | Jo et al. | |

OTHER PUBLICATIONS

TW Patent Application No. 107133100—Taiwanese Office Action and Search Report, dated Oct. 17, 2019, with English Translation, 12 pages.

\* cited by examiner

SEMICONDUCTOR DEVICE ASSEMBLIES INCLUDING MULTIPLE SHINGLED STACKS OF SEMICONDUCTOR DIES

CROSS-REFERENCE TO RELATED APPLICATIONS

This application is a is a division of U.S. application Ser. No. 15/806,808, filed Nov. 8, 2017; which is incorporated herein by reference in its entirety.

TECHNICAL FIELD

The present disclosure generally relates to semiconductor devices, and more particularly relates to semiconductor device assemblies including multiple shingled stacks of semiconductor dies.

BACKGROUND

Packaged semiconductor dies, including memory chips, microprocessor chips, and imager chips, typically include one or more semiconductor dies mounted on a substrate and encased in a plastic protective covering or covered by a heat-conducting lid. The die can include active circuits (e.g., providing functional features such as memory cells, processor circuits, and/or imager devices) and/or passive circuits (e.g., capacitors, resistors, etc.) as well as bond pads electrically connected to the circuits. The bond pads can be electrically connected to terminals outside the protective covering to allow the die to be connected to higher level circuitry.

To provide additional functionality, additional semiconductor dies can be added to a semiconductor device assembly. One approach to including additional semiconductor dies involves stacking the dies over the substrate. To facilitate the electrical connection of dies to the substrate, the dies can be arranged in a shingled stack, where each die is offset horizontally from a die below to leave exposed contact pads of the die that can be bonded (e.g., with a wirebond) to a corresponding bondfinger on the substrate. A drawback of this shingled stacking approach is the limit on the number of dies that can be stacked in this fashion, due to the increasing amount of overhang of each additional die added to the stack.

To address this limitation, shingled stacks of dies can include multiple groups of dies arranged in a shingled fashion, and offset either in the same direction (e.g., as shown in FIG. 1) or in opposing directions (as shown in FIG. 2). In this regard, FIG. 1 illustrates a semiconductor device assembly 100 in which a shingled stack 110 of dies on a substrate 101 includes two groups 102 and 103 of dies 104 which are shingled in the same offset direction, and electrically connected to bondfingers 120 on the substrate 101 by wirebonds 121. As can be seen with reference to FIG. 1, the wirebonds 121 of the first group 102 of dies 104 are underneath an overhang region 111 of the second group 103, and therefore must be formed before the second group 103 of dies 104 is stacked over the first group 102. Moreover, the bottommost die 104 of the second group 103 must be spaced above the topmost die 104 of the first group 102 by a sufficient distance (e.g., provided by a thicker layer of die attach material 105) to allow for a wirebond 121 thereto. Accordingly, drawbacks of this arrangement include the multiple stacking and wirebonding operations that must be iteratively performed, as well as the different die attach material thicknesses, at an increase in manufacturing cost and complexity.

Similar challenges are presented in forming the semiconductor device assembly illustrated in FIG. 2, in which the groups of dies are shingled with opposing offset directions. In this regard, FIG. 2 illustrates a semiconductor device assembly 200 in which a shingled stack 210 of dies on a substrate 201 includes two groups 202 and 203 of dies 204 which are shingled in opposing offset directions, and electrically connected to bondfingers 220 on the substrate 201 by wirebonds 221. As can be seen with reference to FIG. 2, at least some of the wirebonds 221 of the first group 202 of dies 204 are underneath an overhang region 211 of the second group 203, and therefore must be formed before the second group 203 of dies 204 is stacked over the first group 202. Accordingly, drawbacks of this arrangement include the multiple stacking and wirebonding operations that must be iteratively performed, as well as the provision of additional bondfingers in the substrate, at an increase in manufacturing cost and complexity.

DETAILED DESCRIPTION

Figure 1:
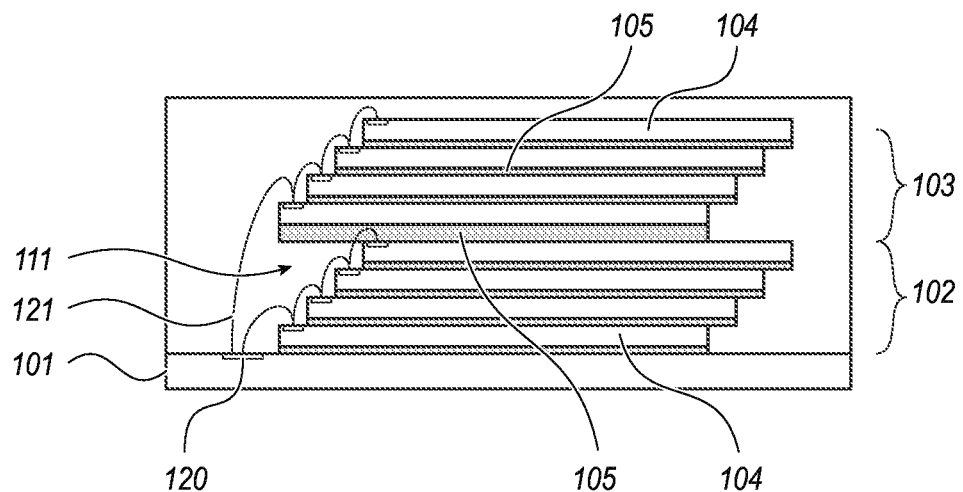
FIG. 1 illustrates a semiconductor device assembly including a shingled stack of semiconductor dies.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, increasing the number of semiconductor dies in a shingled stack in a semiconductor device assembly poses manufacturing challenges that are costly to overcome (e.g., multiple iterative stacking and wirebonding operations, varying die-to-die spacing, etc.). Accordingly, several embodiments of semiconductor device assemblies in accordance with the present technology can provide semiconductor device assemblies with multiple shingled stacks of semiconductor dies to overcome these challenges.

In this regard, several embodiments of the present technology are directed to semiconductor device assemblies that include a substrate having a plurality of external connections, a first shingled stack of semiconductor dies disposed directly over a first location on the substrate and electrically coupled to a first subset of the plurality of external connections, and a second shingled stack of semiconductor dies disposed directly over a second location on the substrate and electrically coupled to a second subset of the plurality of external connections. The semiconductor device assemblies can further include an encapsulant at least partially encapsulating the substrate, the first shingled stack and the second shingled stack.

Specific details of several embodiments of semiconductor devices are described below. The term "semiconductor device" generally refers to a solid-state device that includes a semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

Figure 2:
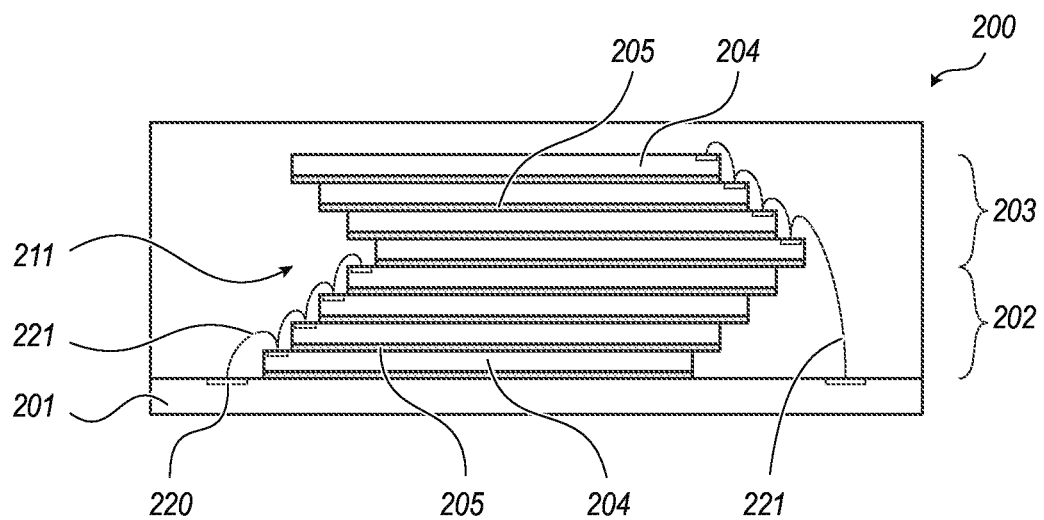
FIG. 2 illustrates a semiconductor device assembly including a shingled stack of semiconductor dies.
Figure 3:
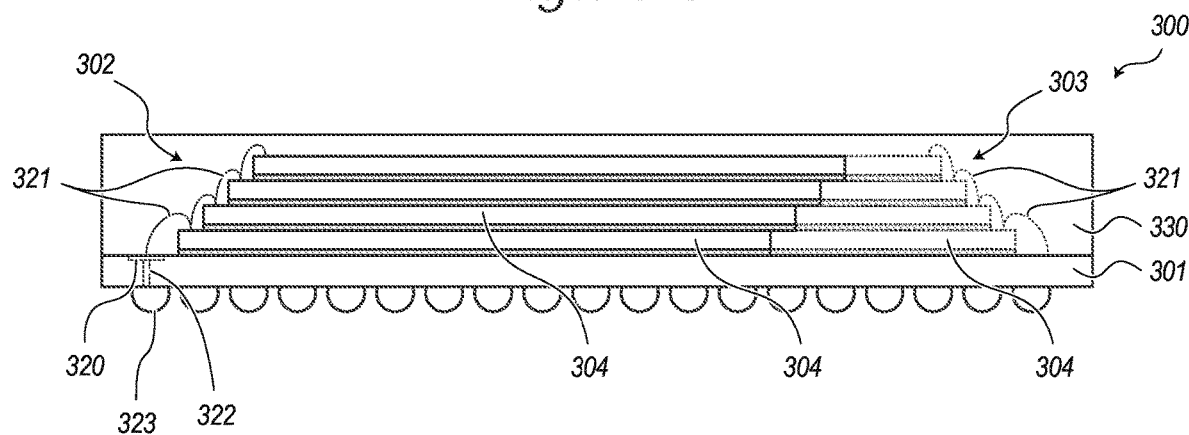
FIG. 3 illustrates a simplified cross-sectional view of a semiconductor device assembly including multiple shingled stacks of semiconductor dies in accordance with an embodiment of the present technology.

FIG. 3 is a simplified cross-sectional view of a semiconductor device assembly including multiple shingled stacks of semiconductor dies in accordance with an embodiment of the present technology. The semiconductor device assembly 300 includes a substrate 301, a first shingled stack 302 of semiconductor dies 304 and a second shingled stack 303 of semiconductor dies 304 (illustrated in broken lines to indicate its recessed position from the cross-sectional plane of view), at least partially surrounded by an encapsulant 330. As can be seen with reference to FIG. 3, each of the first and second shingled stacks 302 and 303 includes four semiconductor dies 304. The bottommost die of each stack 302 and 303 is directly coupled to the substrate 301, and each die 304 in each stack 302 and 303, other than the bottommost, is offset from a die 304 immediately below it by about the same distance in about the same direction (e.g., unlike the shingled stacks illustrated in FIGS. 1 and 2, in which the offset distances in a stack could vary, as in FIG. 1, or in which the offset directions in a stack could vary, as in FIG. 2).

The semiconductor device assembly 300 further includes wirebonds 321 connecting each die 304 in each stack 302 and 303 to the substrate 301. More particularly, each die 304 in each stack 302 and 303 is connected to one or more bondfingers 320 on the substrate 301, which are each connected in turn (e.g., by a via 322) to a corresponding one or more external contacts of the assembly 300, such as solder ball 323. In this regard, because none of the dies 304 in either stack 302 and 303 are under an overhang of another die 304 (e.g., unlike in FIGS. 1 and 2), wirebonds 321 can be formed in a single operation (e.g., uninterrupted by another stacking operation), and each bondfinger 320 can be connected to only a single wirebond 321 (e.g., unlike in FIG. 1).

Figure 4:
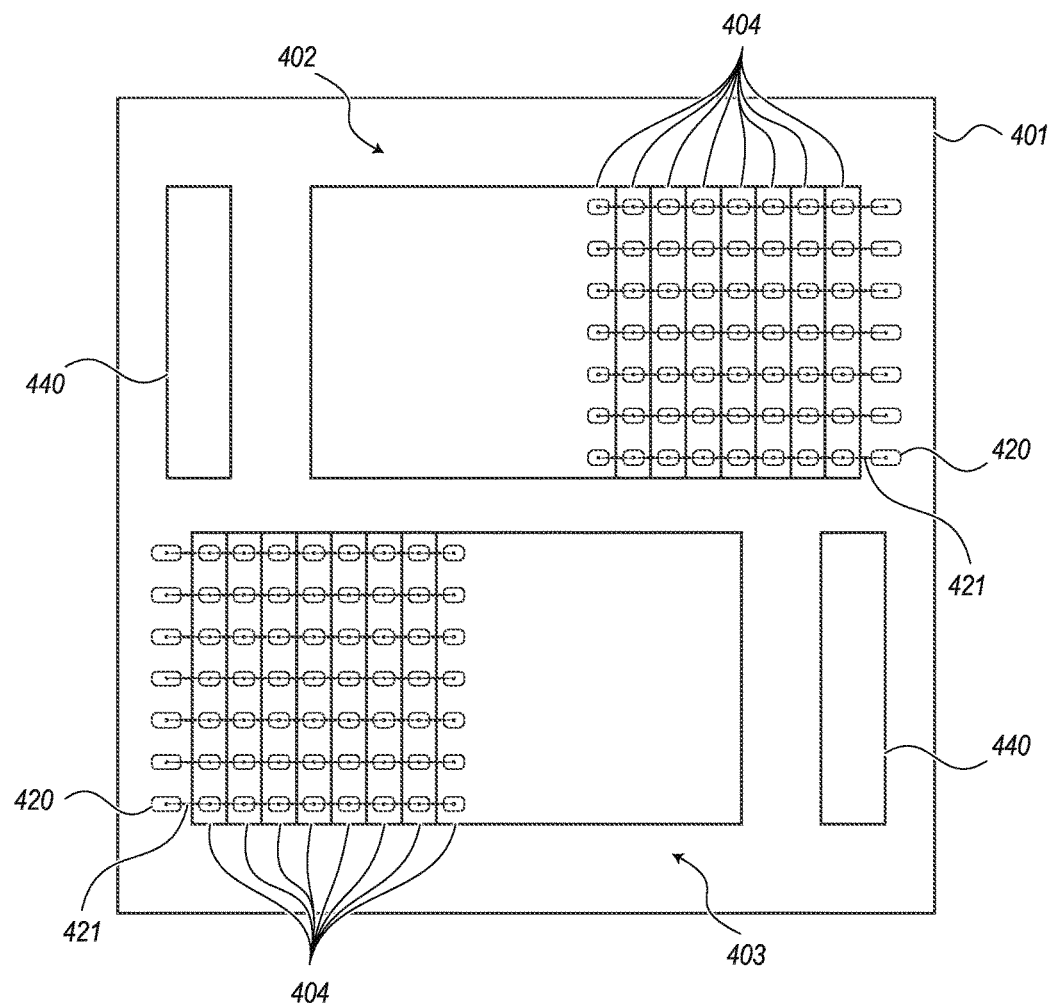
FIG. 4 illustrates a simplified plan view of a semiconductor device assembly including multiple shingled stacks of semiconductor dies in accordance with an embodiment of the present technology.

According to one aspect of the subject technology, a semiconductor device assembly can have multiple shingled stacks of semiconductor dies in different locations on the substrate. This can be better seen with reference to FIG. 4, which illustrates a simplified plan view of a semiconductor device assembly including multiple shingled stacks of semiconductor dies in accordance with an embodiment of the present technology. The semiconductor device assembly 400 includes a substrate 401, a first shingled stack 402 of semiconductor dies 404 and a second shingled stack 403 of semiconductor dies 404. The first shingled stack 402 is disposed in a first location on the substrate 401, and the second shingled stack 403 is disposed in a second location laterally offset from the first. As can be seen with reference to FIG. 4, each of the first and second shingled stacks 402 and 403 includes eight semiconductor dies 404. The bottommost die of each stack 402 and 403 is directly coupled to the substrate 401, and each die 404 in each stack 402 and 403, other than the bottommost, is offset from a die 404 immediately below it by about the same distance in about the same direction (e.g., unlike the shingled stacks illustrated in FIGS. 1 and 2, in which the offset distances in a stack could vary, as in FIG. 1, or in which the offset directions in a stack could vary, as in FIG. 2).

The semiconductor device assembly 400 further includes wirebonds 421 connecting each die 404 in each stack 402 and 403 to the substrate 401. More particularly, each die 404 in each stack 402 and 403 is connected by a plurality of wirebonds 421 to a corresponding plurality of bondfingers 420 on the substrate 401. Because none of the dies 404 in either stack 402 and 403 are under an overhang of another die 404 (e.g., unlike in FIGS. 1 and 2), wirebonds 421 can be formed in a single operation (e.g., uninterrupted by another stacking operation), and each bondfinger 420 can be connected to only a single wirebond 421 (e.g., unlike in FIG. 1).

As set forth above, the semiconductor dies in a semiconductor device assembly can include dies that provide a variety of different functions (e.g., logic, memory, sensors, etc.). In an embodiment in which stacks of shingled memory dies are included in a semiconductor device assembly, an advantage of including multiple stacks of memory dies is the possibility to dedicate different stacks of memory dies to different memory channels (e.g., in a one-to-one relationship where each stack corresponds to one channel, or in an n-to-one or one-to-n relationship in which multiple stacks correspond to each channel, or even multiple channels to each stack).

According to one aspect of the subject technology, another advantage of including two or more shingled stacks of semiconductor dies in a semiconductor device assembly, as opposed to a single, larger stack, is the additional flexibility provided in layout of the assembly, which can permit additional device hardware to be included in the assembly. For example, semiconductor device assembly 400 includes I/O expanders 440, which can be located conveniently adjacent the bondfingers 420 of each stack 402 and 403 of semiconductor dies 404, to facilitate additional connectivity when the semiconductor device assembly 400 is a packaged memory device.

In accordance with one aspect of the subject technology, yet another advantage of providing multiple shingled stacks of dies in a semiconductor device assembly is the reduction in package height that can be achieved (e.g., by using multiple stacks of fewer dies instead of a single, taller stack of dies). Alternatively, another advantage can include the use of thicker semiconductor dies (e.g., which can be more easily manufactured than thinner dies) while maintaining a similar package height as a semiconductor device assembly using a single stack with a greater number of thinner dies.

According to one aspect of the subject technology, an additional advantage of including two or more shingled stacks of semiconductor dies in a semiconductor device assembly, as opposed to a single, larger stack, is the reduction in warpage experienced by the assembly and a corresponding reduction in physical stresses on the external contacts of the assembly. In this regard, an assembly with a single stack of dies disposed generally in the middle of the assembly experiences elevated physical stresses (e.g., due to warpage and thermal effects) in a region generally underneath and within the periphery of the stack, corresponding to a generally central region of the package substrate (e.g., where many of the assembly solder joints may be dedicated to signaling and power). This can reduce the reliability of the solder joints between the assembly and higher-level circuitry (e.g., a module board, package-on-package interposer, or the like). In an assembly with two or more stacks of dies disposed in different locations on the substrate of the assembly, the physical stresses in the middle of the assembly tend to be lower, with elevated stresses occurring, if at all, in more peripheral regions of the package (e.g., where package contacts may be dedicated merely to mechanical robustness, and where electrical connectivity is not required for successful operation of the assembly).

Yet another advantage of the present technology involves the thermal improvements experienced by a semiconductor device assembly with multiple stacks of semiconductor dies, as compared against assemblies with a single stack. In this regard, the thermal impedance of a stack with fewer dies (e.g., with fewer die-to-die interfaces) is lower than a stack with more dies, even for stacks with thicker dies, due to the thermal barriers caused by the alternating layers of silicon and underfill, tape attach, or other adhesive. Accordingly, with improved thermal impedance, a semiconductor device assembly with multiple stacks of semiconductor dies can be operated with a greater input power while performing within an acceptable temperature range, as compared to a semiconductor device assembly with a single stack of more semiconductor dies.

Figure 5:
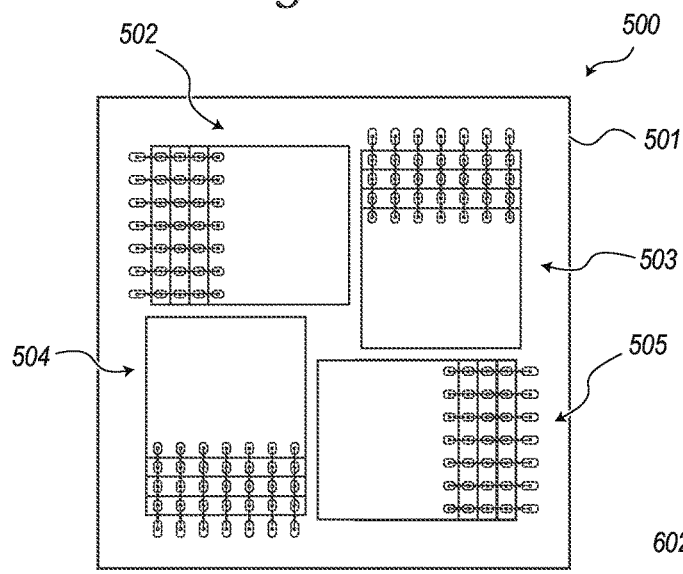
FIG. 5 illustrates a simplified plan view of a semiconductor device assembly including multiple shingled stacks of semiconductor dies in accordance with an embodiment of the present technology.

Although in the foregoing examples semiconductor device assemblies have been described and illustrated with two shingled stacks of semiconductor dies, in other embodiments more stacks can be included. For example, FIG. 5 is a simplified plan view of a semiconductor device assembly including four shingled stacks of semiconductor dies in accordance with an embodiment of the present technology. As can be seen with reference to FIG. 5, the semiconductor device assembly 500 includes a substrate 501 and four shingled stacks 502-505 of semiconductor dies, with features similar to those discussed in more detail above with reference to FIGS. 3 and 4. Each of the shingled stacks 502-505 is disposed in a different location on the substrate 501 (e.g., in adjacent, non-overlapping locations). Although in the example illustrated in FIG. 5 the shingled stacks 502-505 are shown spaced apart from one another, in other embodiments semiconductor device assemblies can include shingled stacks immediately adjacent one another (e.g., in different non-overlapping locations on the substrate, but without spaces therebetween).

Figure 6:
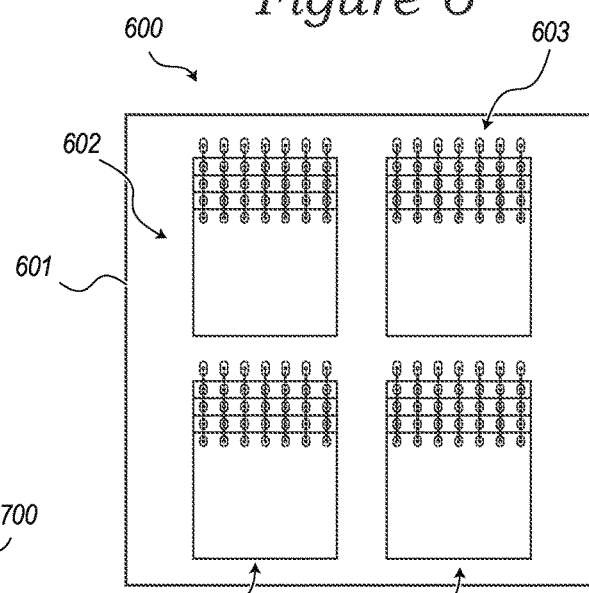
FIG. 6 illustrates a simplified plan view of a semiconductor device assembly including multiple shingled stacks of semiconductor dies in accordance with an embodiment of the present technology.
Figure 7:
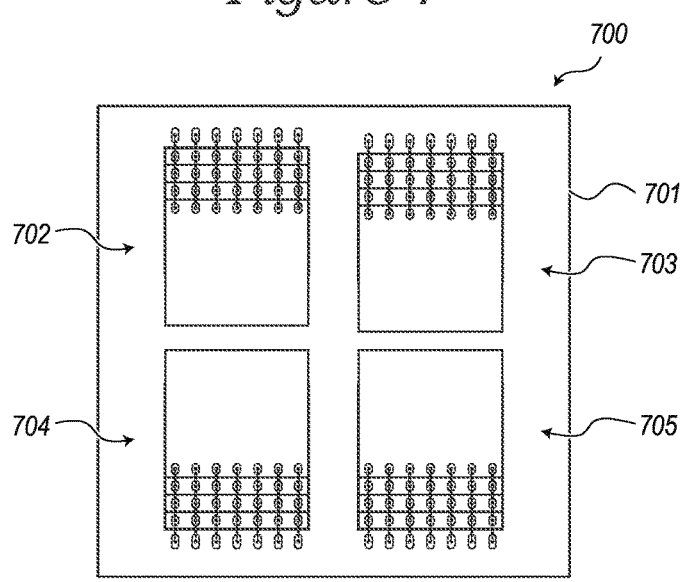
FIG. 7 illustrates a simplified plan view of a semiconductor device assembly including multiple shingled stacks of semiconductor dies in accordance with an embodiment of the present technology.

Although in the foregoing examples semiconductor device assemblies have been described and illustrated with shingled stacks of semiconductor dies that each have different offset directions, in other embodiments some or all of the shingled stacks of dies can share an offset direction. For example, FIG. 6 is a simplified plan view of a semiconductor device assembly including multiple shingled stacks of semiconductor dies in accordance with an embodiment of the present technology. As can be seen with reference to FIG. 6, the semiconductor device assembly 600 includes a substrate 601 and four shingled stacks 602-605 of semiconductor dies, with features similar to those discussed in more detail above with reference to FIGS. 3 and 4. Each of the shingled stacks 602-605 is disposed in a different location on the substrate 601 (e.g., in adjacent, non-overlapping locations), and the shingled stacks all share a same offset direction. In yet another embodiment illustrated in FIG. 7, a semiconductor device assembly 700 includes a substrate 701 and four shingled stacks 702-705 of semiconductor dies. Some of the stacks share one offset direction (e.g., stacks 702 and 703), and other share an opposite offset direction (e.g., stacks 704 and 705).

Figure 8:
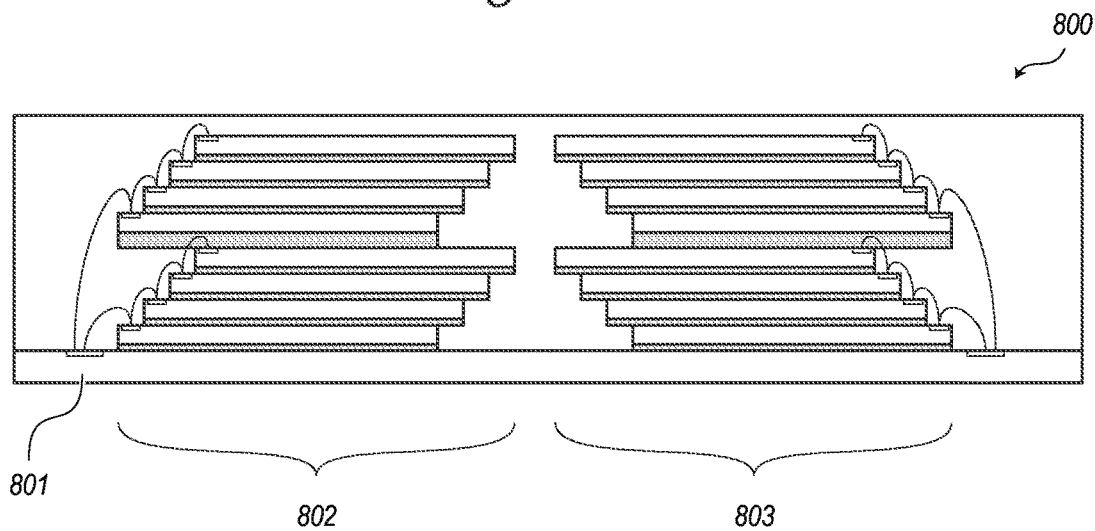
FIG. 8 illustrates a simplified cross-sectional view of a semiconductor device assembly including multiple shingled stacks of semiconductor dies in accordance with an embodiment of the present technology.
Figure 9:
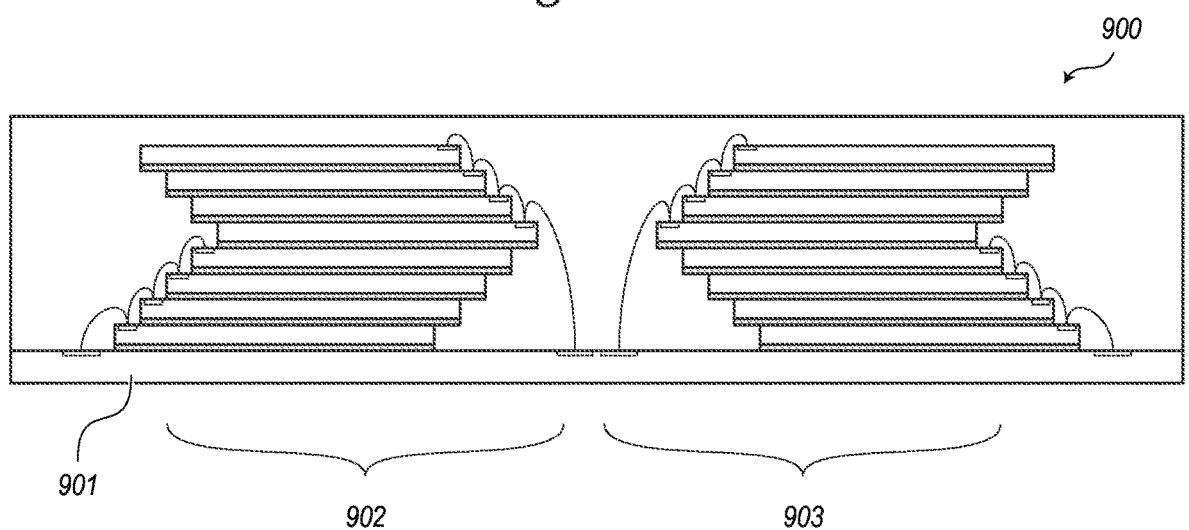
FIG. 9 illustrates a simplified cross-sectional view of a semiconductor device assembly including multiple shingled stacks of semiconductor dies in accordance with an embodiment of the present technology.

Although providing multiple shingled stacks of semiconductor dies can in some embodiments permit a manufacturing method that requires only a single wirebonding step, in other embodiments a semiconductor device assembly can include multiple shingled stacks of semiconductor dies in which die offset directions or die offset distances vary within a single stack. For example, FIG. 8 illustrates a simplified cross-sectional view of a semiconductor device assembly including multiple shingled stacks of semiconductor dies in accordance with an embodiment of the present technology. The semiconductor device assembly 800 includes a substrate 801 and two stacks of semiconductor dies 802 and 803. Each of the stacks 802 and 803 includes groups of shingled semiconductor dies, with a discontinuity in the shingling offset amount between the groups of dies. Although these discontinuities may require iterative stacking and wirebonding steps, the advantages accruing to semiconductor device assemblies with multiple stacks of fewer semiconductor dies, in lieu of a single stack of more dies (e.g., improved rigidity, thermal performance, power handling, etc.) are still enjoyed by the semiconductor device assembly 800 illustrated in FIG. 8. Similarly, FIG. 9 illustrates a simplified cross-sectional view of a semiconductor device assembly including multiple shingled stacks of semiconductor dies in accordance with an embodiment of the present technology. The semiconductor device assembly 900 includes a substrate 901 and two stacks of semiconductor dies 902 and 903. Each of the stacks 902 and 903 includes groups of shingled semiconductor dies, with a discontinuity in the shingling offset direction between the groups of dies. Although these discontinuities may require iterative stacking and wirebonding steps, the advantages accruing to semiconductor device assemblies with multiple stacks of fewer semiconductor dies, in lieu of a single stack of more dies (e.g., improved rigidity, thermal performance, power handling, etc.) are still enjoyed by the semiconductor device assembly 900 illustrated in FIG. 9.

Figure 10:
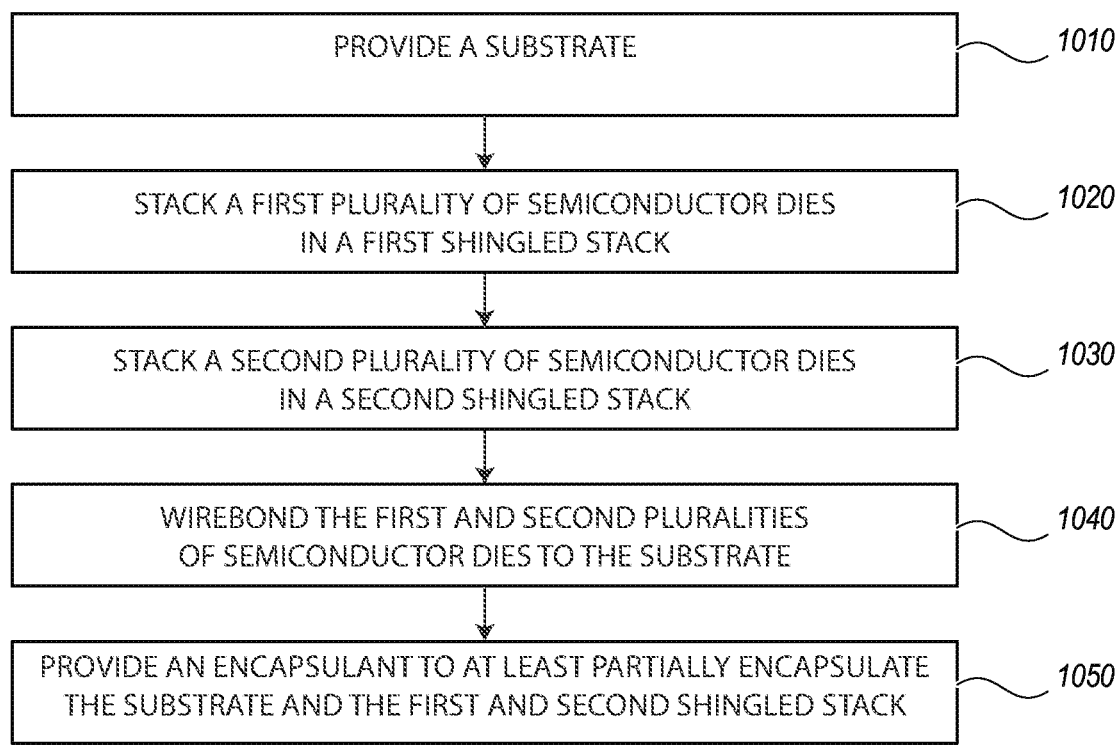
FIG. 10 is a flow chart illustrating a method of making a semiconductor device assembly in accordance with one embodiment of the present technology.

FIG. 10 is a flow chart illustrating a method of making a semiconductor device assembly. The method includes providing a substrate (box 1010), stacking a first plurality of semiconductor dies on the substrate in a first shingled stack (box 1020) and stacking a second plurality of semiconductor dies on the substrate in a second shingled stack (box 1030). In this regard, the first plurality of semiconductor dies can be stacked directly over a first location on the substrate, and the second plurality of semiconductor dies can be stacked directly over a second location on the substrate. The method further includes wirebonding the first and second pluralities of semiconductor dies to the substrate (box 1040), which can be performed subsequent to stacking the first and second shingled stacks, and providing an encapsulant to at least partially encapsulate the substrate, the first shingled stack and the second shingled stack (box 1050). The wirebonding can be performed in a single operation uninterrupted by any stacking.

The method can also further include stacking a third plurality of semiconductor dies in a third shingled stack, stacking a fourth plurality of semiconductor dies in a fourth shingled stack, and wirebonding, subsequent to stacking the third and fourth shingled stacks, the third and fourth pluralities of semiconductor dies to the substrate. In one embodiment, wirebonding the first and second pluralities of semiconductor dies to the substrate can be performed subsequent to stacking the third and fourth shingled stacks.

Although in the foregoing examples, semiconductor device assemblies have been illustrated and described as including shingled stacks of semiconductor dies, in other embodiments of the present technology, semiconductor device assemblies can include multiple stacks of semiconductor dies utilizing different topologies (e.g., vertical stacks, partially shingled stacks, etc.) and interconnection technologies (e.g., TSVs, optical interconnections, inductive interconnections, etc.).

Figure 11:
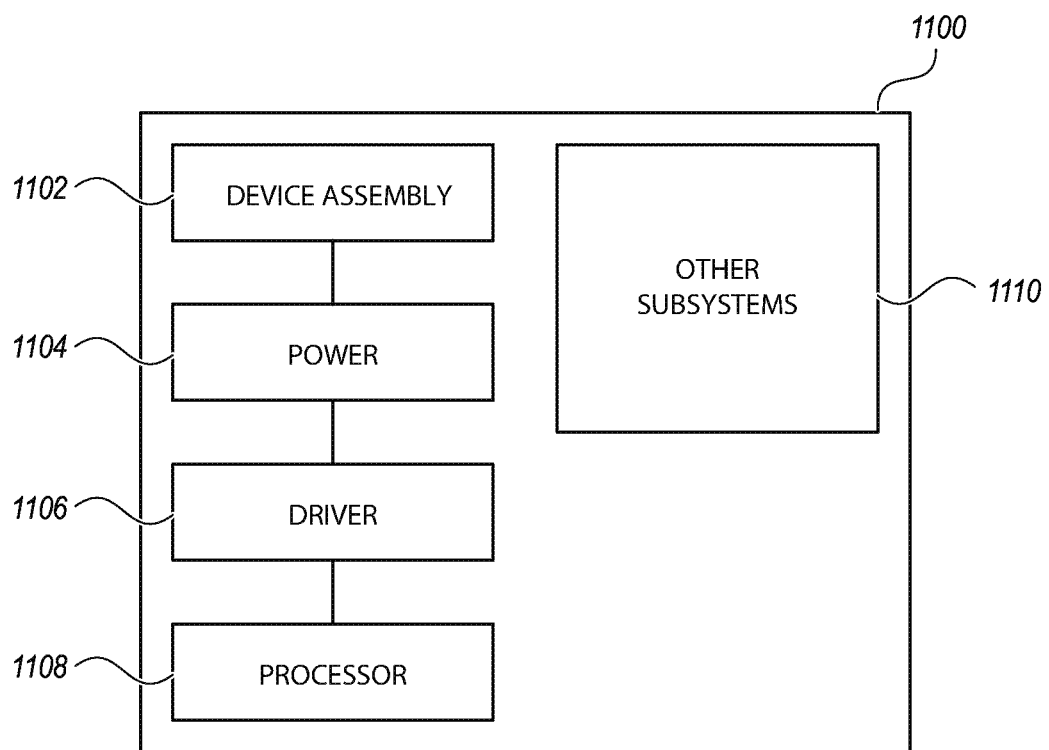
FIG. 11 is a schematic view showing a system that includes a semiconductor device assembly configured in accordance with an embodiment of the present technology.

Any one of the semiconductor device assemblies described above with reference to FIGS. 3-10 can be incorporated into any of a myriad of larger and/or more complex systems, a representative example of which is system 1100 shown schematically in FIG. 11. The system 1100 can include a semiconductor device assembly 1102, a power source 1104, a driver 1106, a processor 1108, and/or other subsystems or components 1110. The semiconductor device assembly 1102 can include features generally similar to those of the semiconductor devices described above with reference to FIGS. 3-10. The resulting system 1100 can perform any of a wide variety of functions, such as memory storage, data processing, and/or other suitable functions. Accordingly, representative systems 1100 can include, without limitation, hand-held devices (e.g., mobile phones, tablets, digital readers, and digital audio players), computers, vehicles, appliances and other products. Components of the system 1100 may be housed in a single unit or distributed over multiple, interconnected units (e.g., through a communications network). The components of the system 1100 can also include remote devices and any of a wide variety of computer readable media.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A method of making a memory device, comprising:
   providing a substrate;
   stacking a first plurality of semiconductor dies on the substrate in a first shingled stack;
   stacking a second plurality of semiconductor dies on the substrate in a second shingled stack;
   wirebonding, subsequent to stacking the first and second shingled stacks, the first and second pluralities of semiconductor dies to the substrate; and
   providing an encapsulant to at least partially encapsulate the substrate, the first shingled stack and the second shingled stack,
   wherein the first shingled stack of semiconductor dies comprise memory dies corresponding to a first memory channel of the memory device, and
   wherein the second shingled stack of semiconductor dies comprise memory dies corresponding to a second memory channel of the memory device.

2. The method of claim 1, wherein the wirebonding is performed in a single operation uninterrupted by any stacking.

3. The method of claim 2, wherein:
   the first plurality of semiconductor dies is stacked directly over a first location on the substrate, and
   the second plurality of semiconductor dies is stacked directly over a second location on the substrate.

4. The method of claim 2, further comprising:
   stacking a third plurality of semiconductor dies in a third shingled stack;
   stacking a fourth plurality of semiconductor dies in a fourth shingled stack; and
   wirebonding, subsequent to stacking the third and fourth shingled stacks, the third and fourth pluralities of semiconductor dies to the substrate.

5. The method of claim 4, wherein wirebonding the first and second pluralities of semiconductor dies to the substrate is performed subsequent to stacking the third and fourth shingled stacks.

6. The method of claim 1, wherein the substrate includes a plurality of external connections, and wherein wirebonding the first plurality of semiconductor dies to the substrate comprises electrically coupling the first plurality of semiconductor dies to a first subset of the plurality of external connections.

7. The method of claim 6, wherein wirebonding the second plurality of semiconductor dies to the substrate comprises electrically coupling the second plurality of semiconductor dies to a second subset of the plurality of external connections.

8. The method of claim 1, wherein the first shingled stack and the second shingled stack include a same number of semiconductor dies.

9. The method of claim 8, wherein the number is one of two, four, eight, or sixteen.

* * * * *